United States Patent [19]
Chiang et al.

[11] Patent Number: 6,040,628
[45] Date of Patent: *Mar. 21, 2000

[54] INTERCONNECT STRUCTURE USING A COMBINATION OF HARD DIELECTRIC AND POLYMER AS INTERLAYER DIELECTRICS

[75] Inventors: Chien Chiang, Fremont; David B. Fraser, Danville, both of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/769,549

[22] Filed: Dec. 19, 1996

[51] Int. Cl.[7] .............................. H01L 23/48; H01L 23/58
[52] U.S. Cl. ....................... 257/760; 257/640; 257/643; 257/752; 257/758; 257/759; 257/763
[58] Field of Search ..................................... 257/640, 642, 257/643, 758–760, 752, 763

[56] References Cited

U.S. PATENT DOCUMENTS

| | | | |
|---|---|---|---|
| 4,001,870 | 1/1977 | Saiki et al. .............................. | 257/643 |
| 5,155,576 | 10/1992 | Mizushima .............................. | 257/760 |
| 5,389,814 | 2/1995 | Srikrishnan et al. .................... | 257/529 |
| 5,500,558 | 3/1996 | Hayashide .............................. | 257/758 |
| 5,616,959 | 4/1997 | Jeng ........................................ | 257/758 |

*Primary Examiner*—Teresa M. Arroyo
*Attorney, Agent, or Firm*—Naomi Obinata

[57] ABSTRACT

A structure and method of fabrication of a semiconductor integrated circuit is described. A first patterned electrically conductive layer contains a low dielectric constant first insulating material such as organic polymer within the trenches of the pattern. A second insulating material such as a silicon dioxide or other insulating material having a greater mechanical strength and thermal conductivity and a higher dielectric constant than the first insulating material is formed over the first patterned electrically conductive layer. Vias within the second insulating material filled with electrically conductive plugs and a second patterned electrically conductive layer may be formed on the second insulating material. The structure can be repeated as many times as needed to form a completed integrated circuit.

20 Claims, 3 Drawing Sheets

INTERCONNECT STRUCTURE USING A COMBINATION OF HARD DIELECTRIC AND POLYMER AS INTERLAYER DIELECTRICS

FIELD OF THE INVENTION

This invention relates to the field of semiconductor processing. More specifically, this invention relates to a structure and method for forming an integrated circuit device having a multilayer interlayer dielectric structure.

BACKGROUND OF THE INVENTION

A semiconductor integrated circuit is built by layering electrically conductive materials patterned in electrical circuitry over a base transistor structure on a semiconductor substrate. The electrically conductive materials are in separate planes, with electrical pathways, or vias, electrically connecting the various layers of electrically conductive materials. Insulating material is held between the planes of electrically conductive material around the vias as well as within the trenches in the circuit pattern of a layer of electrically conductive material. The traditionally used insulating material is silicon dioxide, having a dielectric constant of approximately 4. Silicon dioxide is useful because, among other reasons, it is thermally stable and mechanically strong. However, it has been known that better device performance is achieved with lower capacitance between conductive lines within a layer of conductive material. Lower capacitance is achieved using a material having a lower dielectric constant. One such material for potential replacement of silicon dioxide because of its lower dielectric constant property is organic polymer.

In a typical process using organic polymer as the interlayer dielectric, the sequence begins with a partially fabricated integrated circuit substrate containing a patterned electrically conductive layer. An organic polymer is deposited within the trenches or spacings within the patterned electrically conductive layer as well as to a predetermined thickness above the top surface of the electrically conductive layer. The organic polymer is planarized to flatten the top surface a distance above the surface of the electrically conductive layer. Vias are formed into the organic polymer and electrically conductive plugs are formed within the vias. A second electrically conductive layer is formed on the surface of the organic polymer including the electrically conductive plugs. The process is repeated by patterning the second electrically conductive layer, depositing organic polymer, planarizing the organic polymer, opening vias in the organic polymer, forming plugs in the vias, and so on. Further details on the just-described process flow can be found in Chiang et al, "A Novel Interconnect Structure Using a Hard Mask for Low Dielectric Constant Materials", U.S. Ser. No. 670,624.

To make practical use of organic polymer as the insulating material in a semiconductor device is problematic. Silicon dioxide, the traditionally used material, is about 50 times harder than organic polymer. The elastic modulus of silicon dioxide is about 20 times greater than organic polymer. Organic polymer is mechanically weak compared with silicon dioxide. It is prone to bending and twisting under stress, causing shifting and cracking of adjacent electrically conductive materials. Organic polymer also has significantly lower thermal conductivity than silicon dioxide (3–30 times lower), thus making organic polymer worse for heat dissipation. Poor heat dissipation leads to poor transistor performance in semiconductor integrated circuits. Moreover, organic polymer tends to be chemically reactive to solvents and gas plasma compared with silicon dioxide. This can cause difficulties during the preparation of the vias for accepting electrically conductive plugs because the preparation step includes plasma etching.

It would be advantageous to enable the use of organic polymer for insulating material in semiconductor devices to receive the benefits of its low dielectric constant property, while not otherwise harming structural and thermal integrity of the device.

SUMMARY OF THE INVENTION

This invention is a novel structure for an integrated circuit device utilizing two different insulating materials to form the insulation above and within electrically conductive features. There is a layer of electrically conductive material containing a pattern. A first insulating material substantially fills the trenches in the pattern of the electrically conductive layer. A second insulating material is over the patterned electrically conductive layer. A method of fabricating such a structure is also disclosed. There is provided a patterned electrically conductive material, and the trenches of the pattern are filled with a first insulating material. The first insulating material is planarized, and a second insulating material is deposited over the electrically conductive layer.

DETAILED DESCRIPTION OF THE PREFERRED EMBODIMENTS

Figure 1:
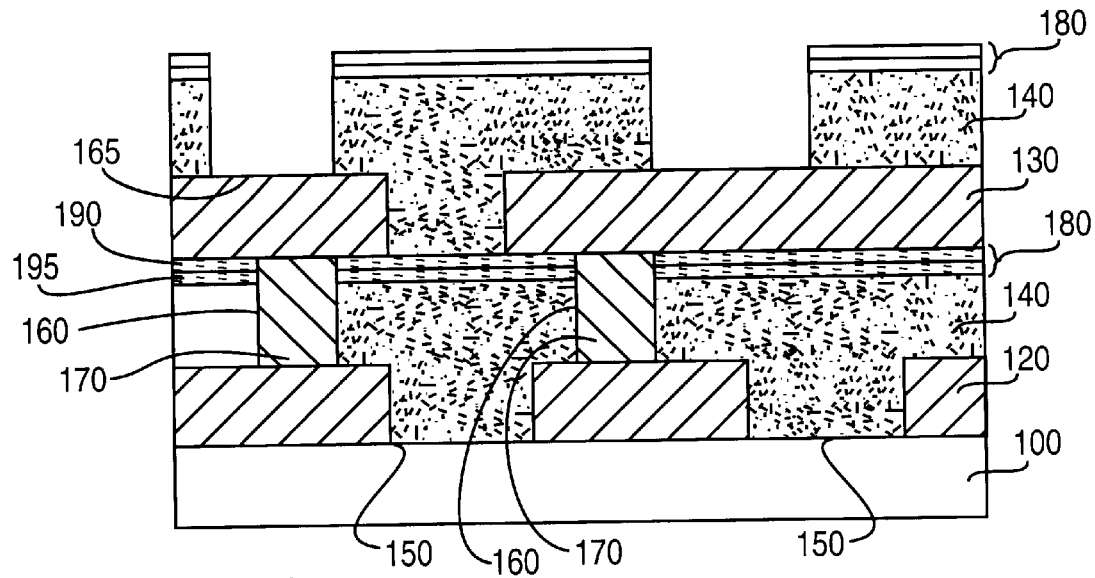
FIG. 1 is a cross sectional view drawing of the related art interconnect structure portion of an integrated circuit structure incorporating organic polymer as insulating material.

FIG. 1 illustrates a related art structure of an interconnect structure made on a substrate 100 using organic polymer as the insulating material. The portion of the integrated circuit structure shown in FIG. 1 is of the first and second levels of metallization. There is a first layer of patterned metal 120 and a second layer of patterned metal 130. An insulation material, in this example an organic polymer dielectric 140, fills the entire space between the first layer 120 and second layer 130 as well as the trenches 150 within the pattern of first layer 120, to dually serve as the interlayer and intralayer (that is, within pattern trenches) dielectric. To electrically connect the metal layers a via hole 160 is created in organic polymer dielectric 140. Via hole 160 is typically filled with an electrically conductive plug 170 such as tungsten, aluminum or copper. Plug 170 forms the electrical contact between first layer 120 and second layer 130. A hard mask 180 made of silicon dioxide 195 and silicon nitride 190, to enable lithographic patterning and plasma etching of organic polymer 140 to create vias 160, also serves as a protective top coating for organic polymer dielectric 140. The structure can be built further upward in a repeated structural sequence. As shown in FIG. 1, over second metal layer 130 is another organic polymer dielectric 140 patterned with via holes 165 for acceptance of another electrically conductive plug, for connection with yet another layer of metal (not shown). The structure can be repeated as many times as necessary to achieve the multilevel semiconductor transistor device desired. While a low dielectric constant material for insulation is desirable for reducing capacitance, the primary shortcoming of organic polymer is that it is more prone to stress than is silicon dioxide. The stress is most prominent between metal layers, where the organic polymer would also serve as a support material for the device structure. The metal layers tend to crack if organic polymer is used as an interlayer dielectric. Organic polymer also has poor heat dissipation compared with silicon dioxide. Heat generated in the device structure during operation of the device is more difficult to remove with organic polymer, which leads to poor device performance.

The present invention enables the use of a low dielectric constant material within the device structure in such a way that the advantages of having a lower dielectric constant material can be realized without bringing detriment to the structure or creating heat dissipation problems. This is achieved by utilizing not one but two insulating materials, each material being placed within the structure in locations that optimize the ability to utilize the relative characteristic advantages of each material. A low dielectric constant material is placed where the low dielectric constant characteristic is needed the most, which is within the trenches of the pattern in a first metal layer. A higher dielectric constant material that can provide the needed structural integrity and heat dissipation is placed where such a material would provide the greater added value, which is between metal layers.

Figure 2:
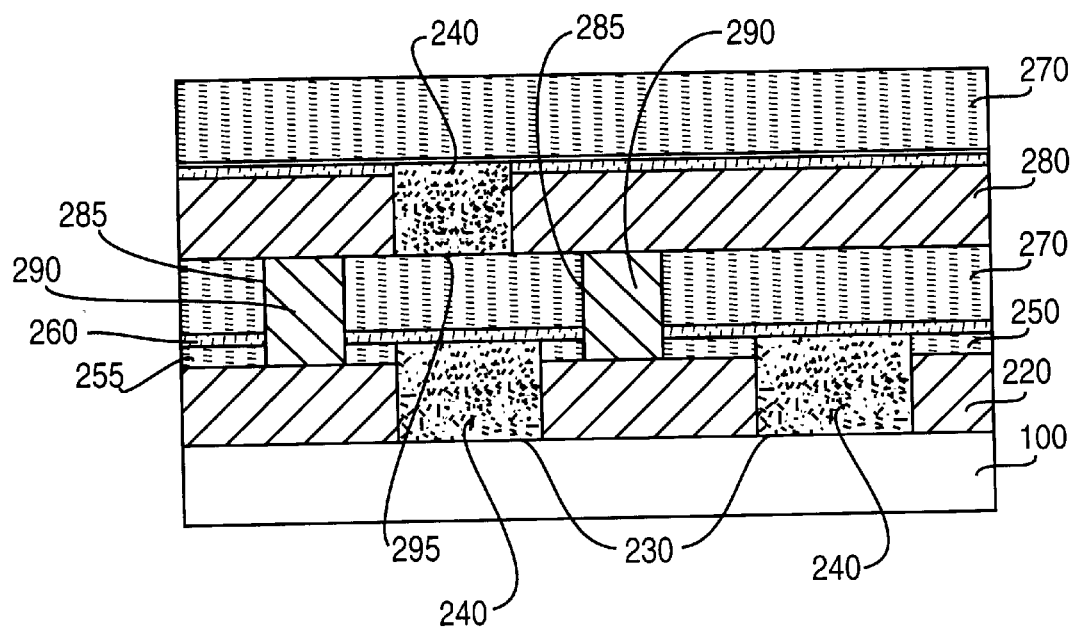
FIG. 2 is a cross sectional view drawing of a preferred embodiment of an interconnect structure portion of an integrated circuit structure using the invention.

FIG. 2 illustrates an embodiment of the structure of the present invention. The novel structure of the present invention is used in any portion of a semiconductor integrated circuit where there is at least one layer of patterned electrically conductive material having insulating material held within the trenches of the pattern and there is a need for insulation over the top of the electrically conductive material. The electrically conductive layer can be any electrically conductive layer within the integrated circuit, including the semiconductor (including polysilicon or silicide) transistor gate, first layer of metal, or other layers of metal including the final layer of metal. The portion shown in FIG. 2 is the first metallization and second metallization in a typical semiconductor integrated circuit.

In accordance with the present invention there is provided a substrate 200 over which is deposited a patterned first metal layer 220, preferably aluminum or aluminum alloy. The thickness of patterned first metal layer 220 varies based on the integrated circuit being fabricated and is generally about 0.5 to 2 microns. Patterned first metal layer 220 contains trenches 230 that are substantially filled with a first insulating material 240. In this invention "substantially filled" means the trenches are filled with first insulating material 240 at least to a level such that the dielectric constant of first insulating material 240 will have a predominant effect on the capacitance within trenches 230. Also for purposes of this invention, the term "trench" is to be construed broadly, and is not to be limited to an opening having parallel straight edges; rather, "trench" can refer to any interstitial spacing within the pattern being substantially filled with first insulating material 240.

The placement of trenches 230 as well as the dimensions are determined based on the circuit pattern for the given metal layer and the design rules for the integrated circuit device being fabricated. Generally, trenches 230 are about 0.5 to 1.5 microns or smaller in width. Trench insulating material 240 is a material having a relatively low dielectric constant that can withstand the temperatures of subsequent processing steps. The dielectric constant is preferably lower than that of silicon dioxide, to reduce the capacitance between the metal lines in patterned first metal layer 220. An example of such a material is a high temperature organic polymer such as polyarylether. Other examples of such materials are silicon oxide glass, fluorinated silicon dioxide, hexagonal boron nitride, silicon carbide, foamed polymer, porous silicon dioxide, or high temperature aerogels. For convenience of description here trench insulating material 240 may sometimes be referred to as organic polymer.

Organic polymer 240 is held within trenches 230. Organic polymer 240 is planar on its top surface. In the embodiment shown here organic polymer 240 is shown to rise a thickness above the line of the top surface 250 of first metal layer 220. The reason organic polymer 240 is shown to rise a thickness above top surface 250 is because it is the result when the structure is manufactured according to a preferred embodiment of the method of formation (which will be described in further detail below). More specifically, a preferred embodiment of the method of formation may include a thin layer of a planarization mask insulating material 255 placed directly on first metal layer 220 in a thickness of about 300 to 1000 angstroms prior to deposition of organic polymer 240. Planarization mask insulating material 255 serves as a stopping layer during planarization of organic polymer 240. Preferably, the same material as interlayer insulating or dielectric material 270 (see below) is used for planarization mask insulating material 255. Because of the placement of planarization mask insulating material 255 on top surface 250 of first metal layer 220, organic polymer 240 when deposited into trenches 230 will as a result be a distance above top surface 250 to match the thickness of planarization mask insulating material 255. Note that if planarization mask insulating material 255 were not present then organic polymer 240 would not rise a distance above top surface 250 and instead would preferably be planar with top surface 250.

The top of organic polymer 240 preferably contains a protective coating 260 made of an insulating material that is mechanically strong. Protective coating 260 is used for protecting organic polymer 240 against potential harm from chemical reactions occurring during subsequent processing. The preferred material for protective coating 260 is silicon nitride, although silicon carbide can also be used. Protective coating 260 is thick enough to protect organic polymer 240 but thin enough that it will not otherwise affect the capacitance of interlayer dielectric 270. In general, protective coating 260 is preferably around 300 angstroms or less in thickness. Note that the need for protective coating 260, the material of protective coating 260 and its thickness are all functions of the material used as trench insulating material 240 and the subsequent fabrication process step(s) that may otherwise chemically attack trench insulating material 240. More specifically by way of example, if the subsequent process fabrication step(s) does not involve a chemically attacking agent such as oxygen, or if trench insulating material 240 is not otherwise prone to attack by oxygen, then protective coating 260 is not needed.

For insulation between metal layers, a different insulating material from trench insulating material 240 is used. Interlayer insulating material 270 is deposited on protective coating 260. Interlayer insulating material 270 is selected to be one that has a higher thermal conductivity and stronger mechanical strength than trench insulating material 240. Such a material will generally have a higher dielectric constant than trench insulating material 240. Preferably interlayer insulating material 270 is silicon dioxide, and for descriptive purposes may be referred to here as silicon dioxide. However, other materials having the requisite dielectric constant, mechanical strength and thermal conductivity for the integrated circuit device being built can be substituted for silicon dioxide. The thickness of silicon dioxide 270 is as per design rule requirements of a given integrated circuit. Usually the thickness is approximately 1 to 2 microns. The top surface of silicon dioxide 270 is preferably planar.

Further in accordance with an embodiment of the present invention, the structure can be built upward by forming a second metal layer and electrically connecting the two metal layers. As shown, a second electrically conductive layer 280, for example, an aluminum metal or alloy, is formed on silicon dioxide 270. Silicon dioxide 270 contains via openings 285 for forming a pathway between the metal planes. This pathway is usually for providing electrical connections between the metal layers, but is also used for providing a thermal pathway. Vias 285, generally of a diameter of about 0.2 to 1 micron depending on the widths of the metal lines directly above and below, are filled with an electrically conductive material to provide a plug 290. Plug 290 is usually made of tungsten. However, plug 290 can also be aluminum or aluminum alloy of copper or other electrically conductive material and can even be a portion of second metal layer 280 extending down into vias 285 (not shown). Second metal layer 280 may itself contain trenches 295 to form a pattern. Placement of second conductive layer trenches 295 as well as the dimensions is determined based on the circuit pattern for the given electrically conductive layer and the design rules for the integrated circuit device being fabricated. Generally, the dimensions are about 0.5 to 1.5 microns in width. The thickness of second metal layer 280 varies also based on the integrated circuit requirements and is generally about 0.5 to 2 microns.

Second conductive layer trenches 295 may also be filled with trench insulating material 240, again preferably organic polymer. If further layers are still to be fabricated then the protective coating and planarization stopping layer and vias described above are repeated until the desired structure is achieved.

The process for fabricating the structure of the invention generally comprises having a first patterned layer of an electrically conductive material, and filling the trenches within the pattern of the first patterned electrically conductive material with a first insulating material and planarizing the first insulating material. Then, a second, different insulating material is deposited over the first electrically conductive layer. If further structure is desired in the integrated circuit, then vias are created within the second insulating material, and a second electrically conductive layer is deposited on the second insulating material. Then, the second electrically conductive layer is patterned, and the trenches in the pattern are filled with the first insulating material, and the process is further repeated as necessary to complete the desired structure.

Figure 3:
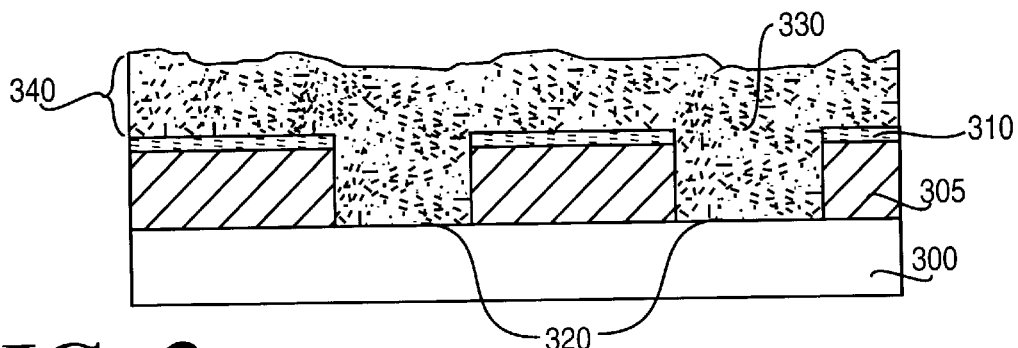
FIG. 3 is cross sectional view drawing of an early step in an embodiment of the process sequence for forming an interconnect structure embodiment of the invention.

FIG. 3 illustrates the first step of an embodiment of a detailed process sequence for fabricating the structure of the invention described above. There is provided a substrate 300 containing a portion of the integrated circuit fabricated. The integrated circuit usually consists of a transistor gate, a source and a drain. The structure of this invention can be fabricated over any portion of the integrated circuit having a first patterned layer of electrically conductive material including the transistor gate, the first layer of metallization, the second layer of metallization, and so on, including over the final layer of metallization. The portion shown in FIG. 3 represents the first layer of metallization as the starting point for describing a detailed process sequence.

There is provided a first layer of electrically conductive material 305. Note that substrate 300 below first layer of electrically conductive material 305 is shown to be planar in FIG. 3. Substrate 300 is often planar in an integrated circuit device, but it may not be planar in some instances or in some layers and may be instead topographical so that areas of first layer of electrically conductive material 305 are of varying depths. As a first step, planarization mask insulating material 310 may be deposited on first layer 305. Deposition techniques can be chemical vapor deposition or other known processes capable of depositing a relatively uniform film at a sufficiently low temperature to avoid flowing or melting of first layer 305 and other films below. Planarization mask insulating material 310 is any insulating material capable of providing a stop for planarization of a to-be-deposited low-dielectric constant material. More specifically, planarization mask material 310 is silicon dioxide or other dielectric having mechanical strength, thermal and insulating characteristics comparable to a to-be-deposited interlayer dielectric. The thickness of planarization mask material 310 is approximately 300 to 1000 angstroms.

Mask material 310 and first layer 305 are patterned using known photolithography and etching techniques to create trenches 320 in accordance with a predetermined mask. Then, a first insulating material 330 is deposited into trenches 320. First insulating material 330 is selected to be one having a relatively low dielectric constant such as an organic polymer, silicon oxide glass, fluorinated silicon dioxide, hexagonal boron nitride, foamed polymer, porous silicon dioxide, or high temperature aerogels or other material having properties of a dielectric constant of less than about 4 as well as capability of withstanding subsequent process temperatures. First insulating material 330 will be generally referred to here as organic polymer. Organic polymer 330 is deposited preferably using a known process such as chemical vapor deposition on first layer 305, preferably in such a manner that it fills trenches 320 completely as well as creating an excess thickness portion 340 above the top of first layer of electrically conductive material 305. Excess thickness portion 340 is variable and is at least thick enough that the lowest dip in the surface of organic polymer 330 is above the top surface of first layer of electrically conductive material 305 plus any additional thickness from an additional material such as planarization mask 310. Usually excess thickness portion 340 need not be more than 0.2 to 1 micron. Organic polymer 330 is then cured as needed to remove volatile contaminants.

Figure 4:
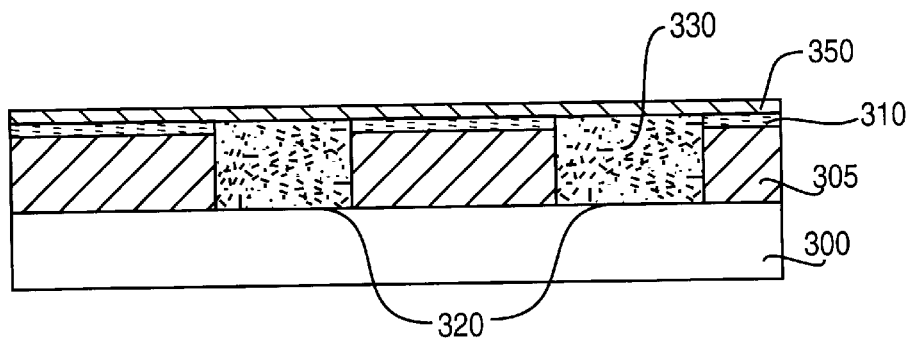
FIG. 4 is a cross sectional view drawing of the planarization step in an embodiment of the process sequence for forming an interconnect structure embodiment of the invention.

FIG. 4 illustrates the next process sequence which is planarization. Organic polymer 330 is planarized to form a substantially smooth flat top surface and to remove any deposited organic polymer 330 from the top surface of mask material 310. Planarization takes place preferably by chemical mechanical polish, although other known methods such as plasma etching can be used. Planarization continues until mask material 310 is reached and then the process is stopped to avoid breakthrough to first metal layer 305.

Next, a protective coating 350 may be deposited to avoid damage to organic polymer 330 from the subsequent process step of forming the interlayer dielectric. Protective coating 350 is preferably a thin coating (300 angstroms or less) of chemical vapor deposited silicon nitride or silicon carbide film, either material being selected for its insulating properties and ability to withstand the chemical attack which can occur during subsequent process step(s).

Figure 5:
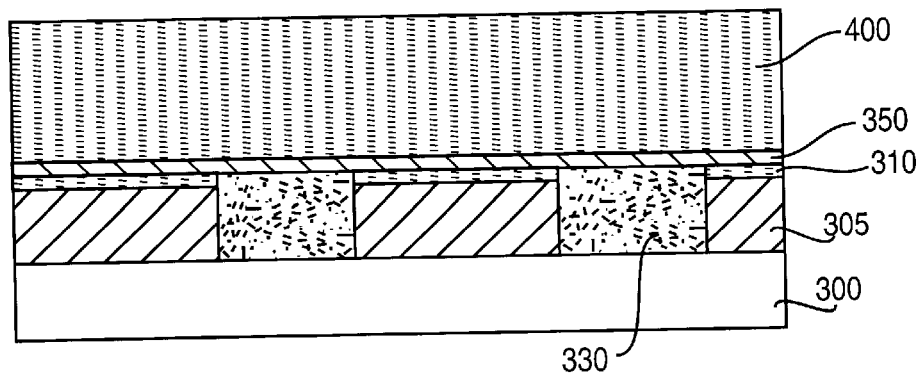
FIG. 5 is a cross sectional view drawing of a possible final step in an embodiment of the process sequence for forming an interconnect structure embodiment of the invention.

FIG. 5 illustrates the next step which is to deposit interlayer dielectric 400. Interlayer dielectric 400 is preferably silicon dioxide but it can be any insulating material having desirable electrical properties and better thermal dissipation and mechanical strength than organic polymer 330. Silicon dioxide 400 is deposited using a known process technique such as chemical vapor deposition to a predetermined thickness in accordance with the design rules of the structure, this usually being around 1 to 2 microns. Known chemical vapor deposition methods will usually provide a substantially planar deposited silicon dioxide 400 since the underlying structure is planar. Chemical mechanical polish may be used as necessary following deposition of silicon dioxide 400 to enhance planarity of the deposited film. This step of depositing interlayer dielectric 400 can be the end of the process sequence, but as described next, further process sequence steps can be performed and additional features can be fabricated for further building the integrated circuit structure upward.

Figure 6:
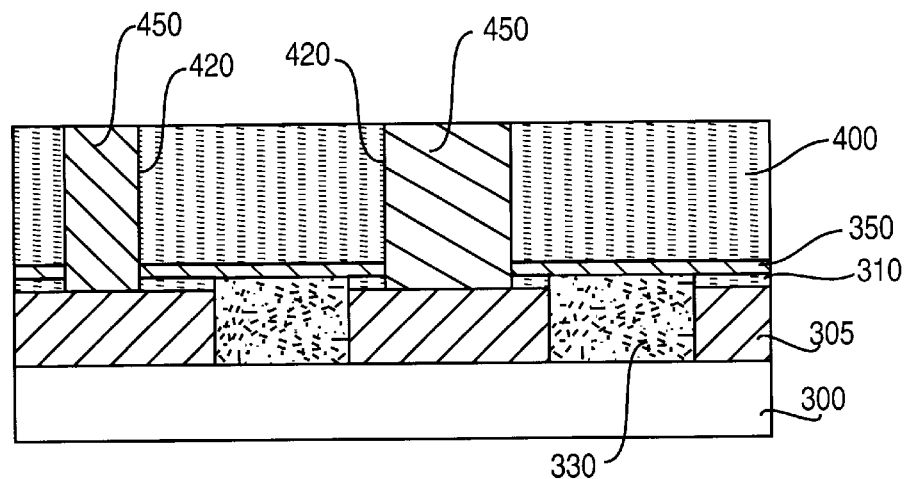
FIG. 6 is a cross sectional view drawing of an additional step in an embodiment of the process sequence for forming an interconnect structure embodiment of the invention.

FIG. 6 illustrates the next step, which is to form vias 420 into interlayer dielectric or silicon dioxide 400. The pattern for vias 420 is created by known photolithography and etching methods in accordance with a predetermined mask pattern. Vias 420 are etched through silicon dioxide 400 as well as any masking layer and protective coating 310, 350, to the underlying top surface of first metal layer 305. Then, vias 420 are filled with electrically conductive material such as tungsten, or aluminum or copper, to form plugs 450. Plugs 450 are formed preferably using a known chemical vapor deposition or physical vapor deposition process combined with an etch back or polishing step as necessary so that the top surface of plugs 450 is planar with the top surface of the surrounding silicon dioxide 400. As an alternative to forming separate plugs 450, vias 420 can be filled with the metal of a to-be-formed second electrically conductive layer (not shown). For example, if a layer of aluminum is to be deposited to form a second electrically conductive layer, then the chemical vapor deposition process or physical vapor deposition process for depositing aluminum can fill vias 420 and apply the second electrically conductive layer as well.

Figure 7:
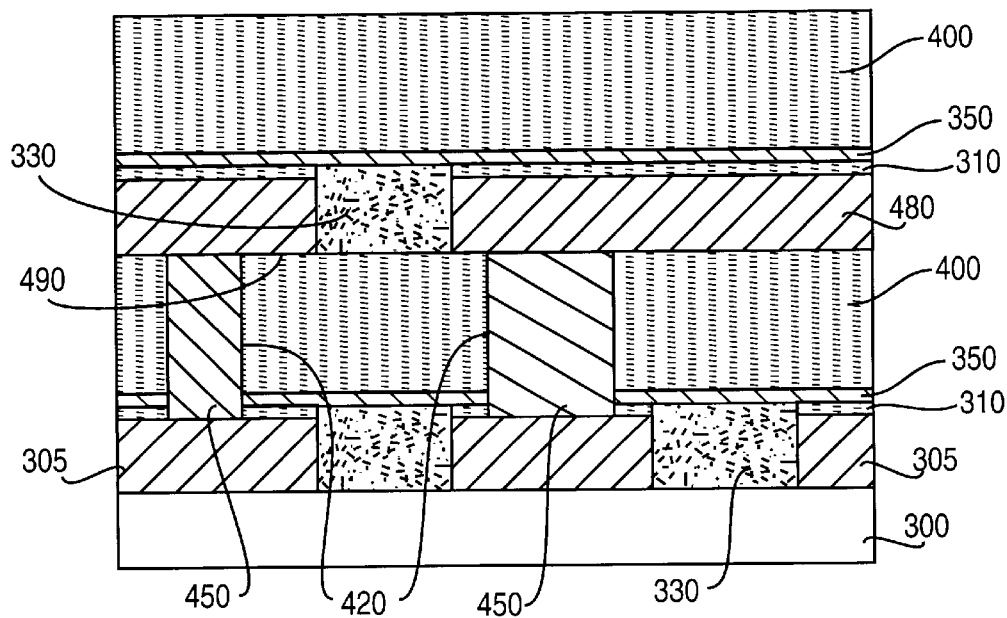
FIG. 7 is a cross sectional view drawing illustrating further steps of an embodiment of the process sequence to create a stacked multilevel structure.

FIG. 7 illustrates the step of depositing a second electrically conductive layer 480 onto silicon dioxide 400 including onto plugs 450. Note that if the same material is used as the plug material, the step of depositing second electrically conductive layer and the via fill can be done in a single step (not shown). Second electrically conductive layer 480 is preferably a metal such as an aluminum or aluminum alloy. Second electrically conductive layer 480 may be deposited by known chemical vapor deposition or physical vapor deposition methods. Following deposition of second metal layer 480, a pattern is formed in second metal layer 480 in accordance with a predetermined mask, using known photolithography and etching techniques.

The process sequence described above can be repeated by depositing a mask insulating layer 310 over the second metal layer 480, creating trenches 490 and filling second metal layer trenches 490 with first insulating material 330, followed by planarizing and application of a protective coating 350, and so on as needed to complete fabrication of the integrated circuit structure. If second electrically conductive layer 480 is the final conductive layer for the device, then second insulating material 400 can be deposited to cover and protect and encapsulate the top surface of second conductive layer 480. This outer layer of second insulating material 400 forms a hermetic seal for the integrated circuit structure.

The present invention has been described both in terms of device structure and method of fabrication. The basic features of the present invention are a first insulating material substantially filling the trenches of a pattern in a layer of electrically conductive material, and a second insulating material formed over the filled patterned electrically conductive material. A second electrically conductive material can be formed so that the second insulating material is sandwiched between two electrically conductive material layers. The first insulating material is selected to reduce capacitance between electrically conductive lines, and the second insulating material is selected to provide structural and thermal properties necessary to the integrity of the integrated circuit. The structure having metal pattern trenches filled with one insulating material and between-metal spacing filled with another insulating material can be repeated to build an integrated circuit device in several layers.

The advantage of this novel structure is in the use of a material having a lower dielectric constant, such as organic polymer, within the integrated device in locations where the advantages of low dielectric constant will be realized the most, while avoiding the negative effects to the structure of using such a material in terms of mechanical strength and thermal conductivity. The negative effects are overcome by using a material having better mechanical strength and thermal conductivity than that held within trenches of the underlying metal, even if it has a higher dielectric constant, where the advantages of the mechanical strength and thermal conductivity will have the most impact, which is between metal layers.

Details on the structure and for fabricating the structure as provided here, may vary and may or may not be necessary depending on the actual materials chosen for each portion of the structure and known strengths and limitations in processing such materials. Other details that have not been provided are those that are known or ascertainable by persons ordinarily skilled in the art, and so have been purposely omitted so as to not obscure the description of the invention. It is intended that substitutions and alterations to the structure or method of the invention can be made without departing from the spirit and scope of the invention as defined by the claims below.

We claim:

1. An integrated circuit structure, comprising:
    a first layer of electrically conductive material in which a trench separates one section of the first layer of electrically conductive material from another section of the first layer of electrically conductive material;
    a planarization stop layer having a thickness of about 300 to 1,000 angstroms formed on the surface of the first layer of electrically conductive material;
    a first insulating material substantially filling the trench of said first layer of electrically conductive material;
    a protective coating having a thickness of less than about 300 angstroms formed over said first insulating material; and a second insulating material deposited over said protective coating.

2. An integrated circuit structure as in claim 1, further comprising a second layer of electrically conductive material formed on said second insulating material.

3. An integrated circuit structure as in claim 2, further comprising openings in said second insulating material to provide a pathway between said first layer of electrically conductive material and said second layer of electrically conductive material.

4. An integrated circuit structure as in claim 3, further comprising an electrically conductive material held within the openings in said second insulating material.

5. An integrated circuit structure as in claim 1, wherein said first insulating material has a dielectric constant that is lower than the dielectric constant of said second insulating material.

6. An integrated circuit structure as in claim 1, wherein said first insulating material is an organic polymer.

7. An integrated circuit structure as in claim 1, wherein said first insulating material is selected from the group consisting of silicon oxide glass, fluorinated silicon dioxide, hexagonal boron nitride, silicon carbide, foamed polymer, porous silicon dioxide, or high temperature aerogels.

8. An integrated circuit structure as in claim 1, wherein said second insulating material is silicon dioxide.

9. An integrated circuit structure as in claim 1, wherein said protective coating is selected from the group comprising silicon nitride or silicon carbide.

10. An integrated circuit structure as in claim 2, further comprising a pattern in said second layer of electrically conductive material.

11. An integrated circuit structure as in claim 9, further comprising said first insulating material held within the trenches of the pattern of said second layer of electrically conductive material.

12. An integrated circuit structure, comprising:
  a first layer of electrically conductive material in which a trench separates one section of the first layer of electrically conductive material from another section of the first layer of electrically conductive material;
  a planarization stop layer formed on the surface of the first layer of electrically conductive material;
  a first insulating material having a first dielectric constant held within the trench of the first layer of electrically conductive material;
  a protective coating covering said first insulating material;
  a second insulating material over said protective coating, said second insulating material having a second dielectric constant, the second dielectric constant being greater than said first dielectric constant;
  a second layer of electrically conductive material over said second insulating material; and
  a via opening within said second insulating material for providing a connection between said first and second layers of electrically conductive material.

13. An integrated circuit structure as in claim 12, wherein said planarization stop layer is comprised of the material of said second insulating material.

14. An integrated circuit structure as in claim 12, wherein said first insulating material is comprised of an organic polymer.

15. An integrated circuit structure as in claim 12, wherein said first insulating material is selected from the group consisting of silicon oxide glass, fluorinated silicon dioxide, hexagonal boron nitride, silicon carbide, foamed polymer, porous silicon dioxide, or high temperature aerogels.

16. An integrated circuit structure as in claim 12, wherein said second insulating material is comprised of silicon dioxide.

17. An integrated circuit structure, comprising:
  a first layer of electrically conductive material in which a trench separates one section of the first layer of electrically conductive material from another section of the first layer of electrically conductive material;
  a planarization stop layer on the top surface of said first layer of electrically conductive material;
  a planar first insulating material filling the trench of the first layer of electrically conductive material;
  a protective coating over said first insulating material and over said planarization stop layer;
  a second insulating material over said protective coating;
  a second layer of electrically conductive material placed over said second insulating material; and
  a via opening within said second insulating material for providing a connection between said first and second layers of electrically conductive material.

18. An integrated circuit structure as in claim 17, wherein said first insulating material has a dielectric constant that is lower than the dielectric constant of said second insulating material.

19. An integrated circuit structure as in claim 18, wherein said first insulating material is comprised of an organic polymer.

20. An integrated circuit structure as in claim 18, wherein said second insulating material is comprised of silicon dioxide.

* * * * *